(12) United States Patent
Hain et al.

(10) Patent No.: US 11,997,834 B2
(45) Date of Patent: May 28, 2024

(54) CONTROL APPARATUS FOR OPERATING AN ELECTRIC DRIVE FOR A VEHICLE HAVING FIRST AND SECOND POWER MODULES WITH A COOLER THEREBETWEEN AND RELATED METHOD

(71) Applicant: ZF Friedrichshafen AG, Friedrichshafen (DE)

(72) Inventors: Stefan Hain, Haag (DE); Michael Sperber, Bayreuth (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 17/011,034

(22) Filed: Sep. 3, 2020

(65) Prior Publication Data

US 2021/0068310 A1     Mar. 4, 2021

(30) Foreign Application Priority Data

Sep. 4, 2019 (DE) .......................... 102019213385.1

(51) Int. Cl.
*H05K 7/20* (2006.01)
*B60L 58/00* (2019.01)

(52) U.S. Cl.
CPC .......... *H05K 7/20845* (2013.01); *B60L 58/00* (2019.02); *H05K 7/20254* (2013.01); *H05K 7/20872* (2013.01); *H05K 7/2089* (2013.01); *H05K 7/20927* (2013.01); *B60L 2210/40* (2013.01)

(58) Field of Classification Search
CPC ............ H05K 7/20254; H05K 7/20927; H01L 23/473; H01H 9/52; B60L 58/00; B60L 2210/40; B60L 15/007; B60L 2240/525; B60L 1/02

See application file for complete search history.

(56) References Cited

U.S. PATENT DOCUMENTS

| | | | |
|---|---|---|---|
| 8,971,041 B2 * | 3/2015 | Sharaf ................ | H05K 7/20927 361/702 |
| 9,847,734 B1 * | 12/2017 | Lei ........................ | B60L 3/0046 |
| 9,961,808 B2 * | 5/2018 | Lei ........................ | H02M 7/003 |
| 9,973,070 B2 * | 5/2018 | Shimizu ............. | H05K 7/20927 |

FOREIGN PATENT DOCUMENTS

| | | |
|---|---|---|
| DE | 10 2011 085 870 A1 | 5/2013 |
| DE | 10 2016 202 547 A1 | 8/2017 |

OTHER PUBLICATIONS

Office Action dated May 26, 2020 for German Patent Application No. 10 2019 213 385.1, (10 pp.), note: pp. 1 and 2 are English language Explanations to Section C. Result of Determination Document.

* cited by examiner

*Primary Examiner* — Zachary Pape

(74) *Attorney, Agent, or Firm* — Crowell & Moring LLP

(57) ABSTRACT

A control apparatus for operating an electric drive for a vehicle may include one or more of the following: a plurality of power module, which has one or more power semiconductors; an intermediate circuit capacitor, which is connected in parallel to the power module; a cooler for dissipating heat generated by the power module; an interconnect device for obtaining electrical contact to the power module, where the interconnect device has a first section and a second section at an angle to the first section, and where the first section and the second section are each perpendicular to a main plane of the power module.

17 Claims, 4 Drawing Sheets

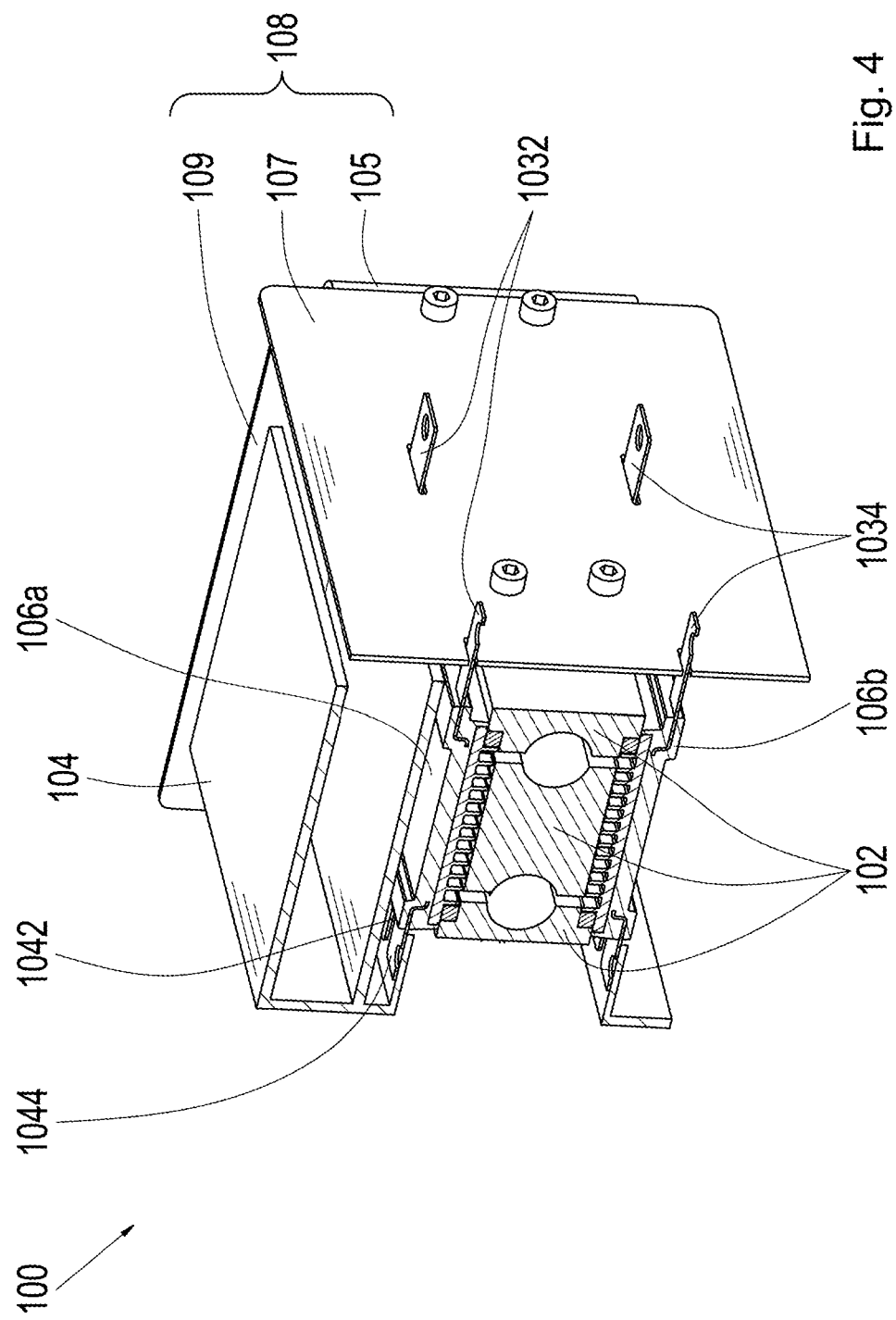

CONTROL APPARATUS FOR OPERATING AN ELECTRIC DRIVE FOR A VEHICLE HAVING FIRST AND SECOND POWER MODULES WITH A COOLER THEREBETWEEN AND RELATED METHOD

RELATED APPLICATION

This application claims the benefit of, and priority to, German Patent Application DE 10 2019 213 385.1, filed Sep. 4, 2019, which is incorporated by reference herein in its entirety.

BACKGROUND

Control apparatuses, in particular integrated control apparatuses, e.g. DC/AC inverters (inverter), are increasingly used in motor vehicles. DC/AC inverters are used to supply electric machines such as electric motors with a multiphase alternating current. A direct current generated by a DC energy source, such as a battery, is converted to a multiphase alternating current. For this purpose, the control apparatuses comprise one or more power modules comprising bridge circuits (such as half bridges). The power modules are based on power semiconductors, in particular transistors such as MOSFETs and HEMTs. These power semiconductors are connected to a interconnect devices, in particular a printed circuit board, for activation purposes.

To avoid complex integrated circuit packaging (ICP) and thus reduce production costs for the inverter, combined interconnect devices are used both to activate a drive (driver) as well as for control (control). Such combined interconnect devices are known as combined control and driver boards (CCDB). This reduces the need for plug-in connectors between the various parts (driver and control parts) of the interconnect devices, but has the disadvantage that when operating the power module by conducting higher currents and through quick switching of the power semiconductors, high interference emissions are generated that feed into the CCDB. This increases the need for additional filtering, in order to obtain a operation of the inverter in accordance with the intended use. Furthermore, known inverters are associated with increased costs and reduced power output.

An integrated control apparatus in the form of an inverter is known from DE 10 2016 202 547 A1. The control apparatus comprises an interconnect device that comprises a first section for driver activation, and a second section for control, wherein the first section and second section are connected to one another by a flexible third section. The known control apparatus has the disadvantage, in addition to high interference, that the number of power modules that can be attached to the cooler is limited, and therefore, the power density of the inverter is limited.

An object of the invention is therefore to create a control apparatus in which the disadvantages described above have been at least partially overcome.

BRIEF DESCRIPTION OF THE DRAWINGS

FIG. 4 shows a schematic illustration of a control apparatus according to another embodiment.

The same reference symbols indicate parts with identical or similar functions in the figures. The respective relevant parts are labeled in the individual figures.

DETAILED DESCRIPTION

Figure 1:
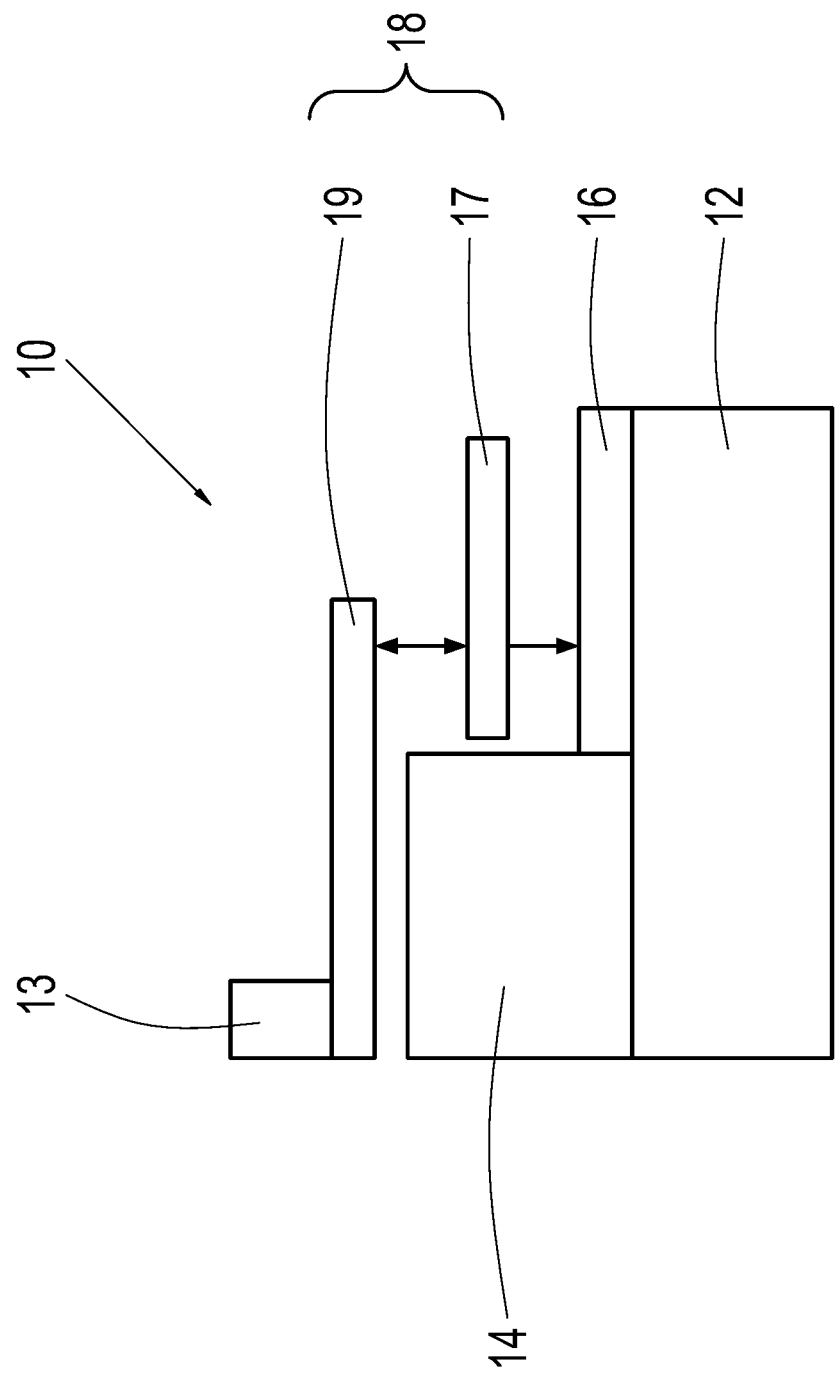
FIG. 1 shows a schematic illustration of a control apparatus according to an embodiment, in a top view.

The control apparatus in the framework of this description is used for operating an electric drive for a vehicle, in particular an electric vehicle, and/or a hybrid vehicle. The control apparatus preferably comprises a DC/AC inverter (Eng.: inverter), or a part thereof. In particular, the control apparatus is used to supply power to an e-machine, e.g. an electric motor and/or a generator. A DC/AC inverter is preferably used to generate a multiphase alternating current from a direct current generated from a DC voltage of an energy source, e.g. a battery.

The control apparatus basically has one or more power modules, an intermediate circuit capacitor, a cooler, and an interconnect device. In addition, the control apparatus can have an input connection for supplying an input current generated with an energy source and an output connection for outputting an output current generated with the input current. With respect to the input current, the power module(s) and the intermediate circuit capacitor can be connected in parallel.

The respective power module is based on power semiconductors with which a bridge circuit assembly is preferably formed. The bridge circuit assembly can comprise one or more bridge circuits in the form of half bridges. Each half bridge comprises a high side switch (HSS) and a low side switch (LSS) connected in series to the high side switch. Each half bridge is assigned to one current phase of a multiphase alternating current (output current).

The HSS and/or LSS comprise one or more power semiconductor components, e.g. IGBTs, MOSFETs or HEMTs. The semiconductor material forming the basis for the HSS or LSS preferably comprises a so-called wide-bandgap semiconductor (semiconductor with a wide bandgap) such as SiC or GaN.

The bridge circuit is attached to the interconnect device. The interconnect device has a first section for activating the drive (for adjusting the gate voltages in the half bridges), and a second section for control. The second section extends at an angle to the first section. Both sections are preferably connected to one another by a flexible third section. The first and second sections of the interconnect device preferably comprise a printed circuit board (PCB) and preferably form a combined control and driver board (CCDB). Alternatively, the first and/or second section can have a different type of interconnect device (with an additional ceramic substrate).

The first sections and the second sections of the interconnect devices can each form an independent interconnect device. In this case, this is an interconnect device assembly that comprises a first interconnect device and a second interconnect device.

The cooler is used to dissipate the heat generated by the power semiconductors, and thus prevent an overheating of the control apparatus. The cooler preferably comprises a metal heat sink, preferably made of aluminum, to which the power modules are thermally coupled. One or more heat conductor layers can likewise be placed between the power modules and the heat sink to reduce the thermal resistance between the power modules and the cooler, which is relatively high due to an air gap formed therebetween.

The connections between the power module(s) and the interconnect device, and/or between the interconnect device and the cooler are preferably obtained in the form of an adhesive, screw, welded, plug-in and/or clamp connection.

The control apparatus can form a three-phase system for converting the input current into a three-phase alternating current, or a six-phase system for converting the input current into a six-phase alternating current.

The power module(s) are flat and extend along a main plane, along which the power module(s) have at least one main surface, preferably two opposing main surfaces, which are larger than the other surfaces of the power module(s).

The first section and second section of the interconnect device are each perpendicular to the power module, or at least to one of the numerous power modules. This means that the first section and the second section of the interconnect device are each perpendicular to the main plane, and thus the main surface(s) of the power module, or at least one of the numerous power modules.

As a result, interference fields that can be traced back to the high input current levels and the quick switching of the power module(s), and which spread out substantially parallel to the flat power module(s), are input less into the interconnect devices. This improves the functionality of the control apparatus. Furthermore, there is no need for additional filtering in order to compensate for the interference. This reduces the production costs for the control apparatus.

According to one embodiment, the first section and the second section are at a right angle to one another.

As a result, the control apparatus can be cube-shaped, such that it has a well-defined structure that facilitates its integration in the installation space in a vehicle.

According to another embodiment, the numerous power modules are attached to two opposing sides of the cooler.

This increases the number of power modules that are cooled, without requiring more installation space. The power density of the control apparatus is therefore comparatively greater.

According to another embodiment, the cooler is located on a main surface of the power module, or at least one of the numerous power modules, defined by the main planes.

As a result, the cooler requires very little space, thus allowing for a compact control apparatus.

According to another embodiment, the intermediate circuit capacitor is located in an installation space defined by power module(s) and the interconnect device.

The installation space preferably extends from a main surface of the power module(s) along a first wall formed by the first section, and a second wall formed by the second section. The main surface also preferably faces away from the cooler.

If the cooler is populated on both sides with power modules that have a first power module group and a second power module group, the assembly comprising the power module(s) and the cooler is preferably located in the middle of the first and/or second section of the interconnect device, such that the first or second sections of the interconnect device extend over both power module groups. In this case, there are two installation spaces, in each of which an intermediate circuit capacitor can be received.

Embodiments shall now be described merely by way of example, and in reference to the attached drawings.

FIG. 1 shows a schematic illustration of a control apparatus 10, preferably in the form of an inverter. The control apparatus 10 has an active cooler 12, a power module 16, an intermediate circuit capacitor 14, an interconnect device 18, and a connection 13. The interconnect device 18 comprises a first section 17 for activating the driver for the power module 16 (indicated by a unidirectional arrow) and a second section 19 for control (indicated by a bidirectional arrow). The positions of the various components in the control apparatus 10 shown in FIG. 1 are purely schematic, and not be understood as drawn to scale.

Figure 2:
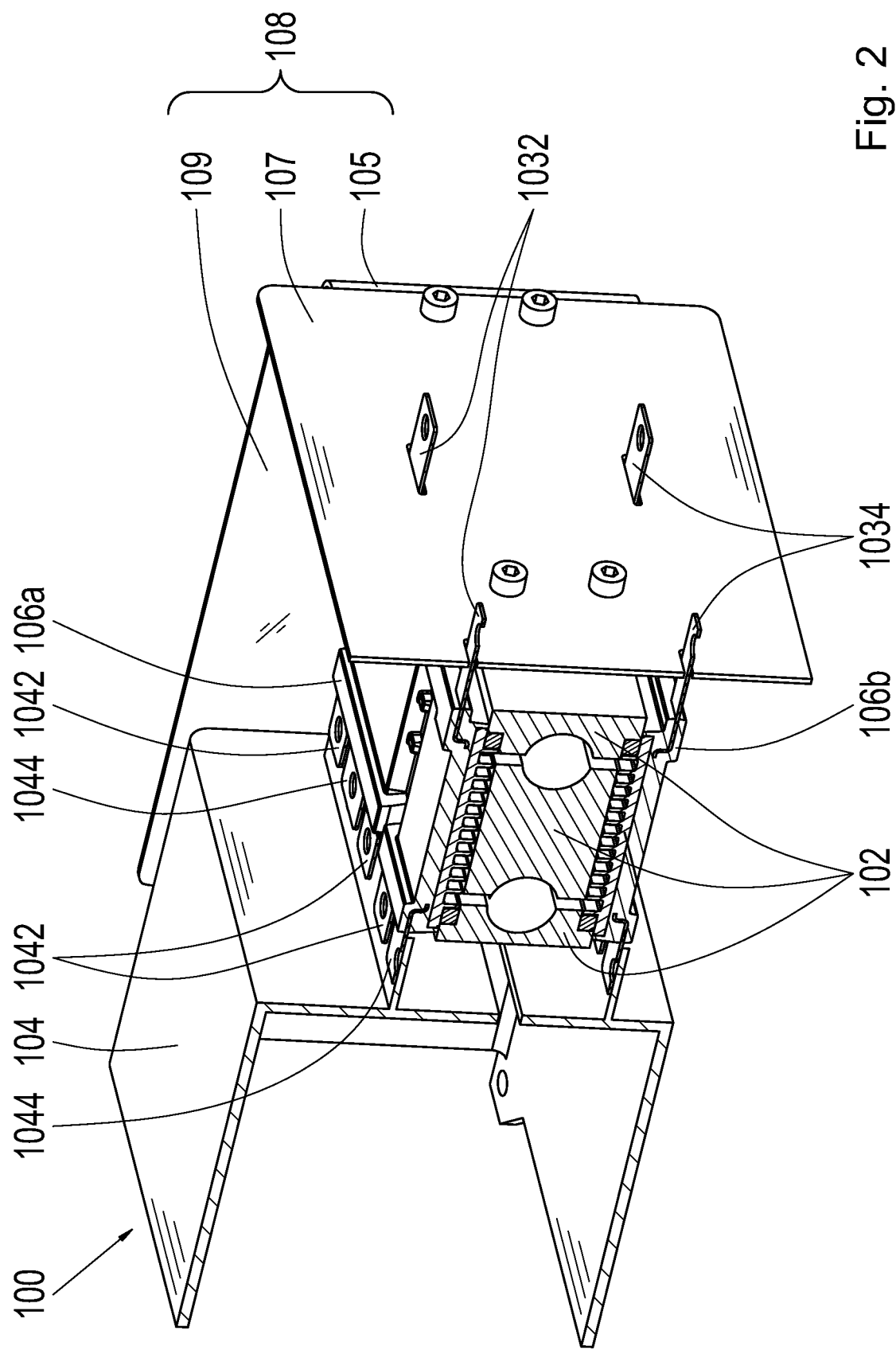
FIG. 2 shows a schematic illustration of a control apparatus according to another embodiment.

FIG. 2 shows a perspective view of an integrated control apparatus 100 according to an embodiment. Like the general control apparatus 10 in FIG. 1, the control apparatus 100 in FIG. 2 likewise comprises an active cooler 102, a power module 106a,b, an intermediate circuit capacitor 104, an interconnect device 108, and a connection 1032, 1034. In concrete terms, the control apparatus comprises a first power module 106a and a second power module 106b, wherein the first power module 106a and the second power module 106b are attached to two opposing sides, specifically on an upper and lower side of the cooler 102 in the perspective view. This means that the cooler 102 is populated on both sides with power semiconductors, thus increasing the power density of the control apparatus 100.

The first power module 106a and the second power module 106b are flat, and extend along a main plane, to which an upward facing main surface of the first power module 106a and a downward facing main surface of the second power module 106b in the perspective view are substantially parallel. The intermediate circuit capacitor 104 comprises two sub-capacitors. An upper sub-capacitor in the perspective view is assigned to the first power module 106a. A lower sub-capacitor in the perspective view is assigned to the second power module 106b. The first section 107 of the interconnect device 108 is located on an end of the power module 106a,b lying opposite the intermediate circuit capacitor 104 (i.e. at the end surface in the perspective view).

Numerous positive contacts 1042 and negative contacts 1044 are located on the intermediate circuit capacitor 104, which are used to make contact with the power modules 106a,b at the input side.

The first section 107 forms a printed circuit board here, by way of example, which is perpendicular to the main plane of the power modules 106a,b. The second section 109 of the interconnect device 108 is likewise perpendicular to the main plane of the power modules 106a,b at the side of the power modules 106a,b. There is a flexible third section 105 between the first section 107 and the second section 109 that connects the first section 107 to the second section 109.

As a result, interference fields that can be traced back to the high input current levels and the quick switching of the power module(s) 106a,b, and which spread out substantially parallel to the flat power module(s) 106a,b, are input less into the interconnect device 108. This improves the functionality of the control apparatus 100. Furthermore, there is no need for additional filtering in order to compensate for the interference. This reduces the production costs for the control apparatus 100.

The control apparatus in FIG. 2 is preferably a six-phase system. The first power module 106a and the second power module 106b preferably each comprise three sub-modules, such that there is a total of six sub-modules in the control apparatus 100. Each sub-module is assigned to one of the six current phases. Accordingly, there is a connection 1032, 1034 for decoupling the respective phase current (i.e. a sub-current of the overall alternating current, wherein each sub-current supports one of the six current phases). It can be seen in FIG. 2 that the connections 1032, 1034 pass through the first section 107 of the interconnect device 108 at the end surface in the perspective view.

Figure 3:
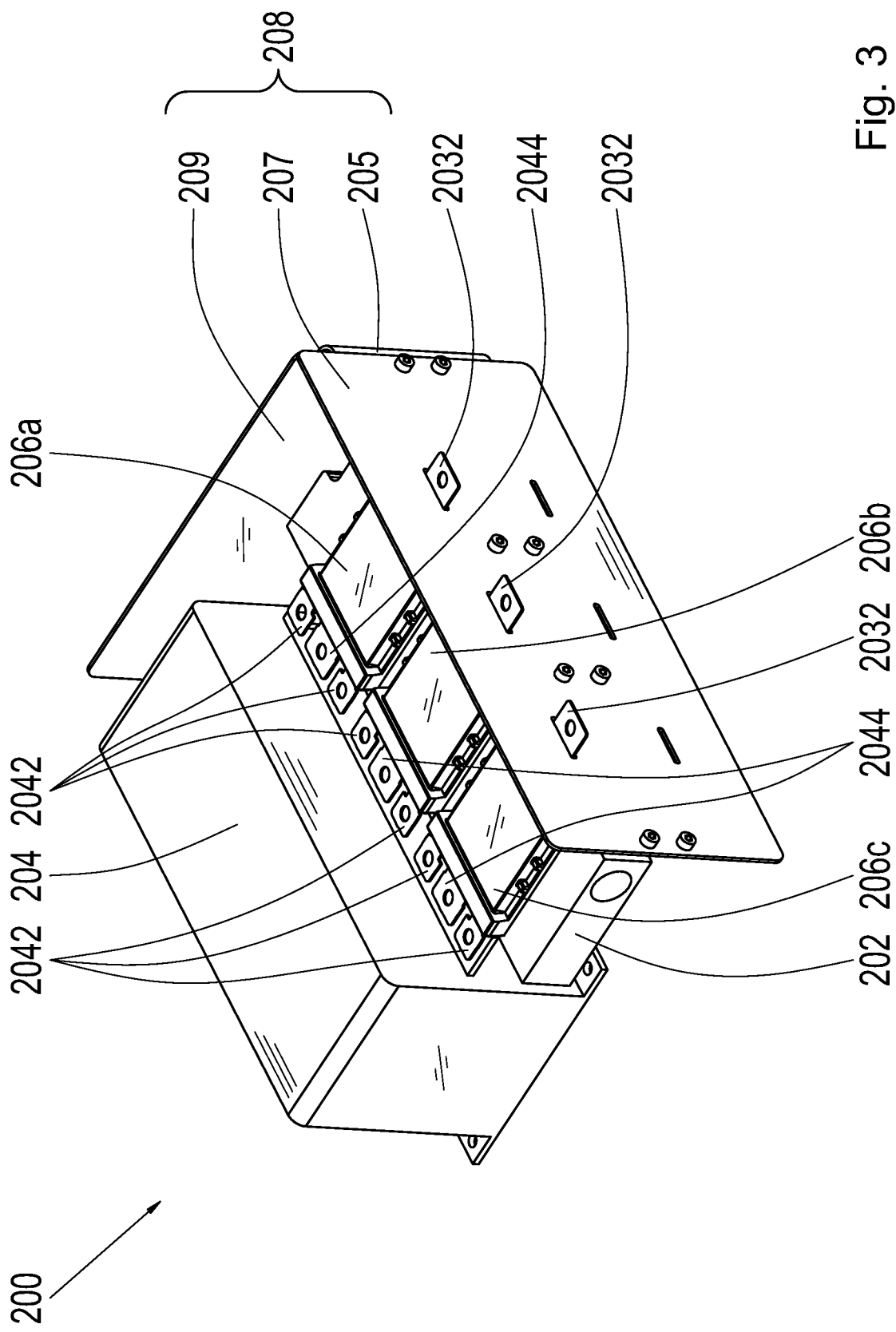
FIG. 3 shows a schematic illustration of a control apparatus according to another embodiment.

FIG. 3 shows a perspective illustration of another integrated control apparatus 200 according to an embodiment. Like the general control apparatus 10 in FIG. 1, and the control apparatus 100 in FIG. 2, the control apparatus 200 in FIG. 3 likewise comprises an active cooler 202, power modules 206a,b,c, an intermediate circuit capacitor 204, an interconnect device 208, and a connection 2032. In differing from the embodiment in FIG. 2, the control apparatus in FIG. 3 is a three-phase system in which the power module comprises three sub-modules 206a,b,c. Each sub-module is assigned to one of the three current phases. Accordingly, there can be three connections 2032 for decoupling the respective phase currents.

FIG. 4 shows a perspective view of an integrated control apparatus 100 according to another embodiment. In an alternative to the embodiments shown in FIGS. 2 and 3, FIG. 4 shows that the intermediate circuit capacitor 104 can be accommodated in an intermediate space/installation space defined by the power modules and the interconnect device. Two such intermediate spaces can be seen in FIG. 2 and FIG. 4. A first intermediate space extends upward from the first power module 106a along the first and second sections 107, 109 in the perspective view. FIG. 4 shows the intermediate circuit capacitor 104 accommodated in this first intermediate space. A second intermediate space extends downward from the second power module 106b along the first and second sections 106, 109 in the perspective view. Such an intermediate space can also be seen in FIG. 3, which extends upward from the power modules 206a,b,c along the first and second sections 207, 209 in the perspective view. This is advantageous, because the control apparatus 100, 200 can assume a more compact form.

REFERENCE SYMBOLS 10 control apparatus
12 cooler
13 connections
14 intermediate circuit capacitor
15 flexible part
16 power module
17 first section
18 interconnect device
19 second section
100 control apparatus
102 cooler
1032 first connection
1034 second connection
104 intermediate circuit capacitor
1042 positive contact
1044 negative contact
105 flexible part
106a first power module
106b second power module
107 first section
108 interconnect device
109 second section
200 control apparatus
202 cooler
2032 connections
204 intermediate circuit capacitor
2042 positive contact
2044 negative contact
205 flexible part
206a first sub-module
206b second sub-module
206c third sub-module
207 first section
208 interconnect device
209 second section

We claim:

1. A control apparatus for operating an electric drive for a vehicle, comprising:
a first power module, which has one or more power semiconductors;
at least a first intermediate circuit capacitor electrically connected to the first power module;
a cooler for dissipation of heat generated by the first power module;
an interconnect device being electrically connected to the first power module, wherein the interconnect device has a first section and a second section at an angle to the first section, wherein the first section and the second section are each perpendicular to a main plane of the first power module; and
a second power module, wherein the second power module is attached to a side of the cooler lying opposite the first power module,
wherein the first section and the second section extend parallel to an axis such that the first section and the second section do not intersect the axis,
wherein the first intermediate circuit capacitor, the first power module, the cooler, and the second power module are arranged in succession along the axis,
wherein the main plane of the first power module and the second power module remain uncovered by the interconnect device such that a first installation space is located adjacent to the first power module and a second installation space is located adjacent to the second power module, and
wherein the first intermediate circuit capacitor is accommodated in the first installation space adjacent to the first power module along the axis and defined by the first power module and the interconnect device.

2. The control apparatus according to claim 1, wherein the first section and the second section form a right angle.

3. The control apparatus according to claim 1, wherein the cooler is located on a main surface of the first power module.

4. A vehicle comprising the control apparatus of claim 1, wherein the vehicle is at least one of an electric vehicle and a hybrid vehicle.

5. The control apparatus of claim 1, wherein a connector extends from the first power module in a direction parallel to a primary plane of the second section such that the connector extends through the first section.

6. The control apparatus of claim 1, wherein the main plane intersects a primary plane of the second section at a right angle.

7. The control apparatus of claim 1, wherein the second section overlaps a portion of a housing of the intermediate circuit capacitor.

8. The control apparatus of claim 1,
wherein the interconnect device has a flexible third section between the first section and the second section that connects the first section to the second section.

9. A method, comprising:
assembling a control apparatus, where the control apparatus comprises:
a first power module, which has one or more power semiconductors;
at least a first intermediate circuit capacitor electrically connected to the first power module;
a cooler for dissipation of heat generated by the first power module;

an interconnect device being electrically connected to the first power module, wherein the interconnect device has a first section and a second section at an angle to the first section, wherein the first section and the second section are each perpendicular to a main plane of the first power module; and a second power module, wherein the second power module is attached to a side of the cooler lying opposite the first power module, wherein the first section and the second section extend parallel to an axis such that the first section and the second section do not intersect the axis, wherein the first intermediate circuit capacitor, the first power module, the cooler, and the second power module are arranged in succession along the axis, wherein the main plane of the first power module and the second power module remain uncovered by the interconnect device such that a first installation space is located adjacent to the first power module and a second installation space is located adjacent to the second power module, and wherein the first intermediate circuit capacitor is accommodated in the first installation space adjacent to the first power module along the axis and defined by the first power module and the interconnect device.

10. The method according to claim 9, wherein the first section and the second section form a right angle.

11. The method according to claim 9, wherein the cooler is located on a main surface of the power module.

12. The method of claim 9, further comprising placing the control apparatus in a vehicle.

13. The method of claim 12, wherein the vehicle is at least one of an electric vehicle and a hybrid vehicle.

14. The method of claim 9, wherein a connector extends from the power module in a direction parallel to a primary plane of the second section such that the connector extends through the first section.

15. The method of claim 9, wherein the main plane intersects a primary plane of the second section at a right angle.

16. The method of claim 9, wherein the second section overlaps a portion of a housing of the intermediate circuit capacitor.

17. The method of claim 9,
wherein the interconnect device has a flexible third section between the first section and the second section that connects the first section to the second section.

* * * * *